US005563536A

United States Patent [19]
Hösl et al.

[11] Patent Number: 5,563,536
[45] Date of Patent: Oct. 8, 1996

[54] DRIVER CIRCUIT HAVING LOW VOLTAGE DETECTION AND HIGH CURRENT DETECTION

[76] Inventors: Werner Hösl, VDK-Strasse 17, 92507, Nabburg; Andreas Gründl, Haseneystrasse 20, 81337, München; Bernhard Hoffman, Jacob-Tresch-Strasse 9, Starnberg, all of Germany

[21] Appl. No.: 335,231

[22] Filed: Nov. 7, 1994

[30] Foreign Application Priority Data

Nov. 8, 1993 [DE] Germany ............. 43 38 083.2

[51] Int. Cl.⁶ .................................................. H03K 3/00
[52] U.S. Cl. .......................................... 327/108; 327/365
[58] Field of Search .............................. 327/77, 78, 108, 327/109, 110, 111, 112, 142, 143, 379, 365, 389; 361/92, 100; 326/21, 33

[56] References Cited

U.S. PATENT DOCUMENTS

| 4,667,121 | 5/1987 | Fay et al. ............... | 307/580 |
| 4,876,517 | 10/1989 | Arcus ...................... | 330/277 |
| 4,980,576 | 12/1990 | Rossi et al. ............. | 307/270 |
| 5,144,172 | 9/1992 | Palara et al. ............. | 327/77 |
| 5,313,112 | 5/1994 | Macks ..................... | 327/143 |
| 5,349,243 | 9/1994 | McClure ................. | 327/108 |
| 5,381,330 | 1/1995 | Grundl et al. .......... | 363/132 |
| 5,391,940 | 2/1995 | Linn ........................ | 327/546 |

FOREIGN PATENT DOCUMENTS

| 2103091 | 7/1972 | Germany . |
| 2525741B2 | 1/1979 | Germany . |
| 2912693 | 10/1979 | Germany . |
| 3614832C2 | 11/1989 | Germany . |
| 4230510C1 | 9/1993 | Germany . |
| 53-112048 | 9/1978 | Japan . |
| 57-113606A | 7/1982 | Japan . |
| 62-250704A | 10/1987 | Japan . |

Primary Examiner—Timothy P. Callahan
Assistant Examiner—Jeffrey Zweizig
Attorney, Agent, or Firm—Haverstock & Associates

[57] ABSTRACT

A more efficient driver circuit for a power output stage, comprising a power driver stage activating the power output stage; a trigger circuit having an input stage and activating the power driver stage; and a power supply stage, wherein the input stage comprises a means for the potential-separated feeding of input signals, and the power supply stage comprises a means for the potential-separated feeding of electrical power. Such a driver circuit allows short signal propagation delays, is compact and small in size and has a wide clock frequency bandwidth.

59 Claims, 6 Drawing Sheets

DRIVER CIRCUIT HAVING LOW VOLTAGE DETECTION AND HIGH CURRENT DETECTION

FIELD OF THE INVENTION

This invention relates to the field of driver circuits. More particularly, this invention relates to the field of driver circuits for any output power stages which have a FET input.

BACKGROUND OF THE INVENTION

A problem with conventional driver circuits is that the time delays between the input connection of the driver circuit and the output connection are relatively long, i.e. the reaction times upon interferences are relatively high. Furthermore, the minimum "on" inhibit times cannot be adjusted to a short enough value and there is a definite limit to the clock frequency duty cycle ranges.

From DE 36 14 832 C2 it has been known to provide a galvanically separating signal transmission circuit which generates galvanically separated output signals from digital input signals through an input coil and a switch-operated output coil spaced apart from the input coil. The coils are spaced such that practical reaction force nondirectional output signals are provided at the terminals of the output coil. A purpose of this circuit is to provide for a sufficient voltage strength which is subject, at the same time to only a small number of switching operations.

From DE 29 12 693 A1 it has been known to provide a buffer amplifier using a transformer for the potential separation of pulses. The buffer amplifier is designed such that it operates very accurately in that supply currents and signal currents are separated.

DE 21 03 091 A1 describes a transistor chopper modulator comprising a transformer in which a grounded shield is mounted between the primary and secondary windings wound adjacent to each other on the transformer core for the purpose of minimizing interferences. With said modulator it is to be ensured that no spurious signals occur.

DE 25 25 741 B2 shows a clock pulse system comprising a rather complex transformer in which the primary and secondary windings are wound on the core of the transformer as two intertwined wires. With the described arrangement two symmetrical timed pulse signals can be generated and distributed free of a DC portion.

From Patents Abstracts of Japan, Sect. E, vol. 2 (1978) No. 145 (E-75) referring to JP 53-112048 A2 it has been known to provide a signal isolating circuit supplying an analog output signal free of interferences from a transformer having at least one or more windings and a sample holding circuit with a saturated core.

Patents Abstracts of Japan, Sect. E, vol. 6 (1982), No. 205 (E-136) referring to JP 57-113606 A describes an isolation amplifying circuit which is used as a control means for signal transfer. The sample period and the phase are adjusted such that the excitation current equals zero. This allows the use of a transformer and a simple circuit providing high accuracy at the same time.

An insulating type voltage detector has been known from Patents Abstracts of Japan, Sect. E, vol. 12 (1988), No. 124 (E-601) referring to JP 62-25 07 04 A, which serves to reduce the number of parts and improve at the same time the reliability of the circuit in that the output signal of an inverter is used directly as an activation signal for an insulating amplifier.

The present invention is therefore based on the problem of providing a driver circuit which allows short signal propagation delays, is compact, has a broad signal clock frequency band width and has increased operational safety.

SUMMARY OF THE INVENTION

The present invention provides a more efficient driver circuit for a power output stage, comprising a power driver stage activating the power output stage; a trigger circuit having an input stage and activating the power driver stage; and a power supply stage, wherein the input stage comprises a means for the potential-separated feeding of input signals, and the power supply stage comprises a means for the potential-separated feeding of electrical power. Such a driver circuit allows short signal propagation delays, is compact and small in size and has a wide clock frequency bandwidth.

DETAILED DESCRIPTION OF THE PREFERRED EMBODIMENT

Figure 1:
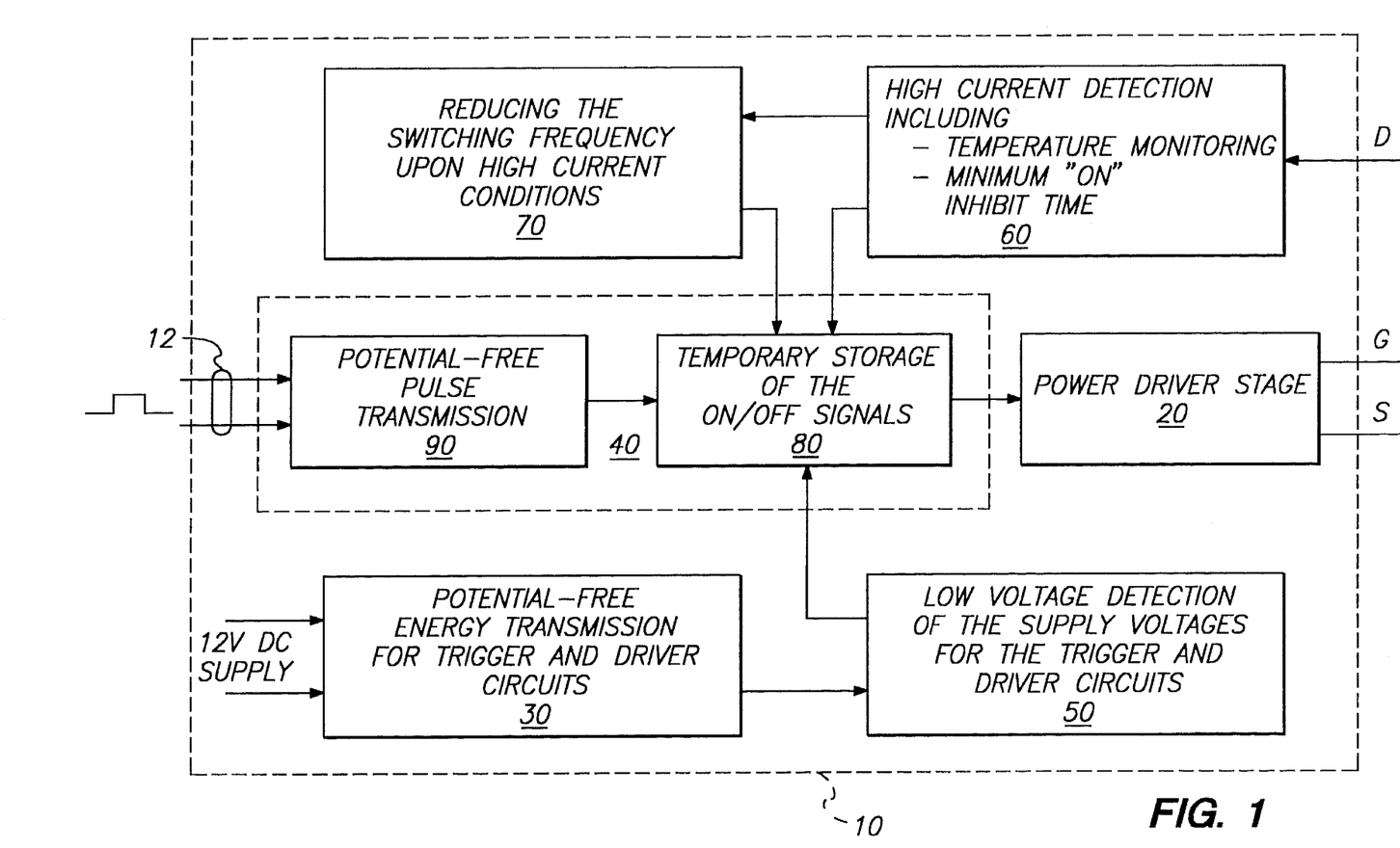
FIG. 1 is a block circuit diagram of a driver circuit for a MOSFET power output stage.

FIG. 1 is a block circuit diagram of a driver circuit for a MOSFET power output stage (not shown, as it is, for instance, described in DE 42 30 510 C1 having an earlier filing date).

Driver circuit 10 comprises the following structural units: a power driver stage 20, a power supply 30, a trigger circuit 40 activating the power driver stage 20, a low voltage detection stage 50, a high current detection stage 60, and a repeat pulse inhibiting stage 70.

Trigger circuit 40 includes an input stage 90 and a memory stage 80.

The driver circuit is supplied with digital control signals, via inputs 12, the lower limit of the frequency of which is practically in the DC voltage signal range, and the upper limit of which is in the range of 1–2 MHz. The pulse-duty factor of the input signal can be between 0% and 100%.

Power supply 30 is powered by a +12 V DC voltage source; positive and negative voltages required for operating driver circuit 10 are generated from the 12 V DC voltage by power supply 30.

Power driver stage 20 comprises a gate terminal G and an emitter terminal E for the power output stage. Besides, high current detection stage 60 includes a drain terminal D which also is to be coupled to the power output stage.

Power driver stage 20 is activated by memory stage 80 of trigger stage 40. Propagating of the activation signals by memory stage 80 is effected only when: 1. high current detection stage 60 does not supply an inhibiting signal to memory stage 80, because the power output stage consumes too much drain current, 2. low voltage detection stage 50 does not supply an inhibiting signal to memory stage 80, because at least one of the operating voltages of the power supplies has fallen below a predetermined level, or 3. high current status detected by high current detection stage 60 occurred so long ago that a predetermined time fixed in repeat pulse inhibiting stage 70 has expired.

Memory stage 80 is supplied with input signals by input stage 90, the output signals of input stage 90 being potential-separated with respect to the input signals, i.e. input signals and output signals of input stage 90 do not have a common reference potential.

This applies accordingly to the operating voltages generated by power supply 30. For operating the individual units, power supply 30 generates both positive and negative operating voltages (+15 V, +20 V, −20 V for IGBT and +12 V, −5 V for MOSFET). These operating voltages as well do not have a common reference potential with the external +12 V supply voltage.

Figure 2:
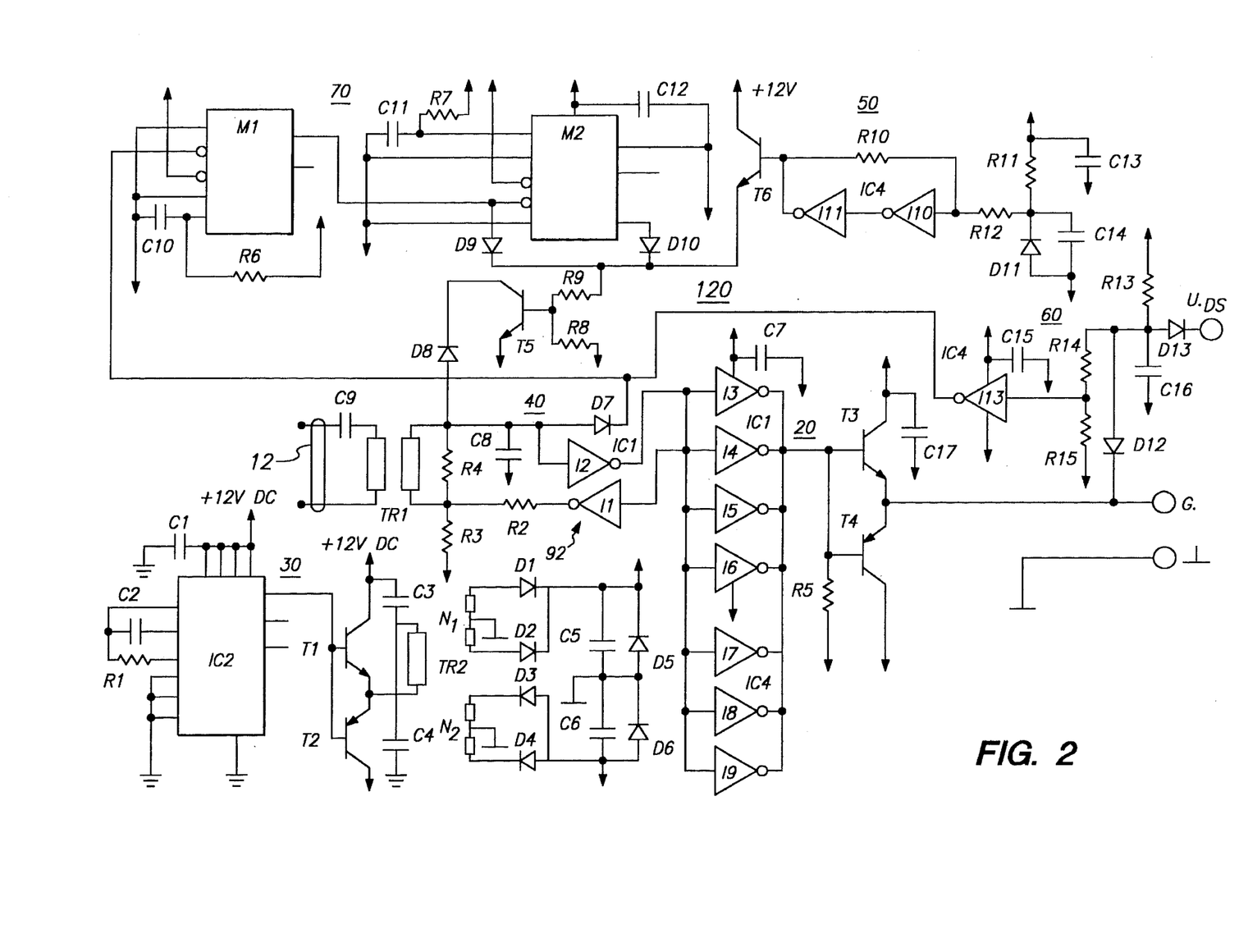
FIG. 2 is an electric circuit diagram of the driver circuit for a MOSFET power output stage according to FIG. 1.

FIG. 2 illustrates circuit details of driver circuit 10 of FIG. 1. Integrated CMOS components (inverter, driver, oscillator, monoflops) are used.

Power supply stage 30 is an oscillator IC2 whose clock frequency is fixed to a frequency in the range of 0.5 MHz to 5 MHz, preferably 1.5 MHz, by a resistor R1 and a capacitor C2. Oscillator IC2 supplies a square wave pulse train serving to activate an amplifying stage formed of two driver transistors T1, T2 which are coupled as complementary emitter follower.

The respective collector terminals of transistors T1, T2 are coupled to the 12 V DC voltage source (positive pole and ground) and parallely coupled to two electrolyte capacitors C3, C4 coupled in series. The primary winding of a transformer TR2 is located between the point of connection of the two electrolyte capacitors C3, C4 and the connection to the emitter of the two driver transistors T1, T2. Transformer TR2 is a ferrite ring core transformer having a shield, each, at the primary side and at the secondary side. Shielding is effected by a metallic jacket around the ring core which extends around the ferrite core and is coupled to the operational voltage ground and is designed as a radially slotted torus section beneath the respective coil windings.

Transformer TR2 has two center-tapped windings N1, N2 at the secondary side, each of said windings being coupled to two diodes D1, D2; D3, D4 in a center rectifier circuit mode. The outputs, in each case, are coupled to two electrolyte capacitors C5, C6 for smoothing, each of which has a parallely coupled Zener diode D5, D6.

Limited by the breakthrough voltage of the Zener diodes D5, D6, power supply stage 30, in each case, supplies a positive and a negative operating voltage (+12 V, −5 V) that is maintained constant.

Input stage 90 comprises a transformer TR1, to the one terminal of which, at the primary side, a DC blocking capacitor C9 is coupled. The other terminal of transformer TR1, at the primary side, and the other terminal of DC blocking capacitor C9 form the input terminals 12 of driver circuit 10. Transformer TR1 (as to further details it is referred to FIGS. 5, 6) is also a ferrite ring core transformer having a shield, each, at the primary side and at the secondary side. Shielding is effected by a metallic jacket which is coupled to the operating voltage ground and extends around the ferrite core and is designed as radially slotted torus section beneath the respective coil windings.

A parallel resistor R4 is provided at the secondary side of transformer TR1. The one terminal of the secondary side of transformer TR1 is coupled via a resistor R3 to the negative operating voltage and the other terminal of the secondary side of transformer TR1 is coupled via a capacitor C8 to the negative operating voltage. The terminal of the secondary side that is coupled to the negative operating voltage via resistor R3 is coupled to the output of an inverter I1 via a resistor R2. The other terminal of the secondary side is coupled to the input of an inverter I2. The input of inverter I1 is coupled to the output of inverter I2 and forms the output of a memory flip-flop 92 constituted by said current arrangement and serving for the temporary storage of the input signals supplied through transformer TR1.

Power driver stage 20 has a two-stage design. A first stage is composed of seven parallely coupled CMOS inverters I3–I9, the inputs of which are coupled to the output of memory flip-flop 92. The number of inverters of said first stage is not critical. The number could be greater or smaller. It is merely important that they supply a sufficient output with adequate edge slope rate for activating the following second stage. Said second stage is composed of two driver transistors T3, T4 which are coupled as complementary emitter followers. Terminal G for the gate terminal of the power output stage is the connecting line between the two emitter terminals.

Low voltage detection stage 50 is composed of two serially coupled inverters I10, I11, the output of inverter I11 being fed back to the input of inverter I10 by a resistor R10. A voltage divider network is disposed at the input of inverter I10, via a series resistor R12, which consists of a resistor R11 coupled to the positive operating voltage and a parallel connection of a Zener diode D11 in the non-conducting direction coupled to a capacitor C14, which are coupled to the negative operating voltage. An electrolyte capacitor C13 is coupled to the positive operating voltage and the negative operating voltage.

The inverters I10, I11 coupled in series operate in a linear operating mode due to the feedback resistor R10. When the voltage at the Zener diode D11 approaches the Zener voltage, i.e. when the voltage ratio between positive and negative operating voltages and the dividing voltage determined by resistor R11 approaches the Zener voltage, because the positive and/or negative operating voltage decreases, the input potential at the input of inverter I10 changes such that the switch-over point of inverters I10, I11 is reached. Because of the feedback resistor R10 the current consumption of inverters I10, I11 increases so that the power supply is loaded additionally (with about 35 mA). If it has a defect, the operating voltage falls further so that inverters I10, I11 pass their switching point in any case. Then the inhibiting signal is supplied to the temporary memory stage 80 and the current consumption of the inverters I10, I11 decreases again (to about 1 mA).

The output of inverter I11 feeds the base of a transistor T6, the collector of which is coupled to the positive operating voltage, and the emitter of which is coupled to a combining circuit 120 which combines the inhibiting signals for temporary memory stage 80.

The input of combining circuit 120 is resistor R9 which, together with a serially coupled resistor R8, constitutes a voltage divider with respect to the negative operating voltage. The base of a transistor T5 is coupled to the point of connection of resistors R8, R9, the emitter of which is coupled to the negative operating voltage and the collector of which is coupled to the cathode of a diode D8. The anode of diode D8 is coupled to the input of inverter I2 of memory stage 40.

High current detection stage 60 comprises an inverter I13, the input terminal of which is coupled to the cathodes of two diodes D12, D13 via a voltage divider formed of two resistors R14, R15. In addition, the cathodes of diodes D12, D13 are coupled to the positive operating voltage via a resistor R13, and to the negative operating voltage via a capacitor C16. The anode of diode D13 is the sensor connection for the drain source voltage of the power output connection for the drain source voltage of the power output stage, while the anode of diode D13 senses the gate voltage or the output voltage of the emitters of transistors T3, T4.

As soon as the drain source voltage of the power output stage exceeds a predetermined value, inverter I13 changes its output status and, via a diode D7, inhibits memory element 92 of the input stage.

RC network R13–C16 causes a response delay of the high current detection stage and is designed such that the power output stage can become entirely conductive before memory element 92 can be inhibited and can no longer propagate any further activation signals. To this end, RC network R13–C16 is designed in such a way that it causes a response delay of about 100 ns.

Repeat pulse inhibiting stage 70 is formed of two serially coupled monoflops M1, M2, the input of the first monoflop M1 being also coupled to the output of high current detection stage 60. The time constant of the first monoflop M1 is determined by an RC circuit R6–C10. The output of the first monoflop M1 is coupled to the input of the second monoflop M2 and to combining circuit 120 via a diode D9, the inhibiting signals for the temporary memory stage 80 being combined in said combining circuit 120. The time constant of the second monoflop M2 is determined by an RC circuit R7–C11. The output of the second monoflop M2 is coupled to combining circuit 120 via a diode D10.

Figure 3:
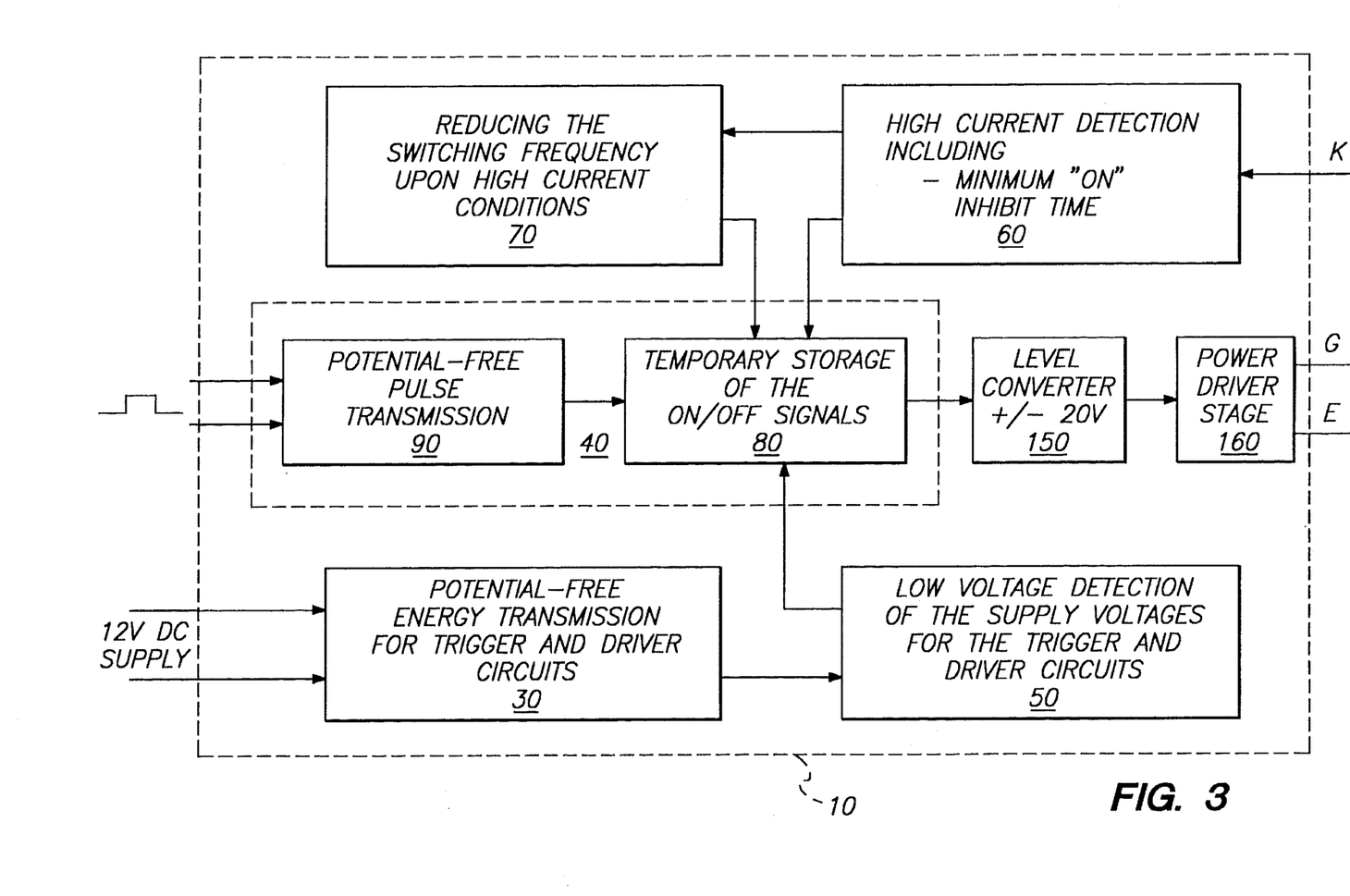
FIG. 3 is a block circuit diagram of a driver circuit for an IGBT power output stage.
Figures 4, 4B:
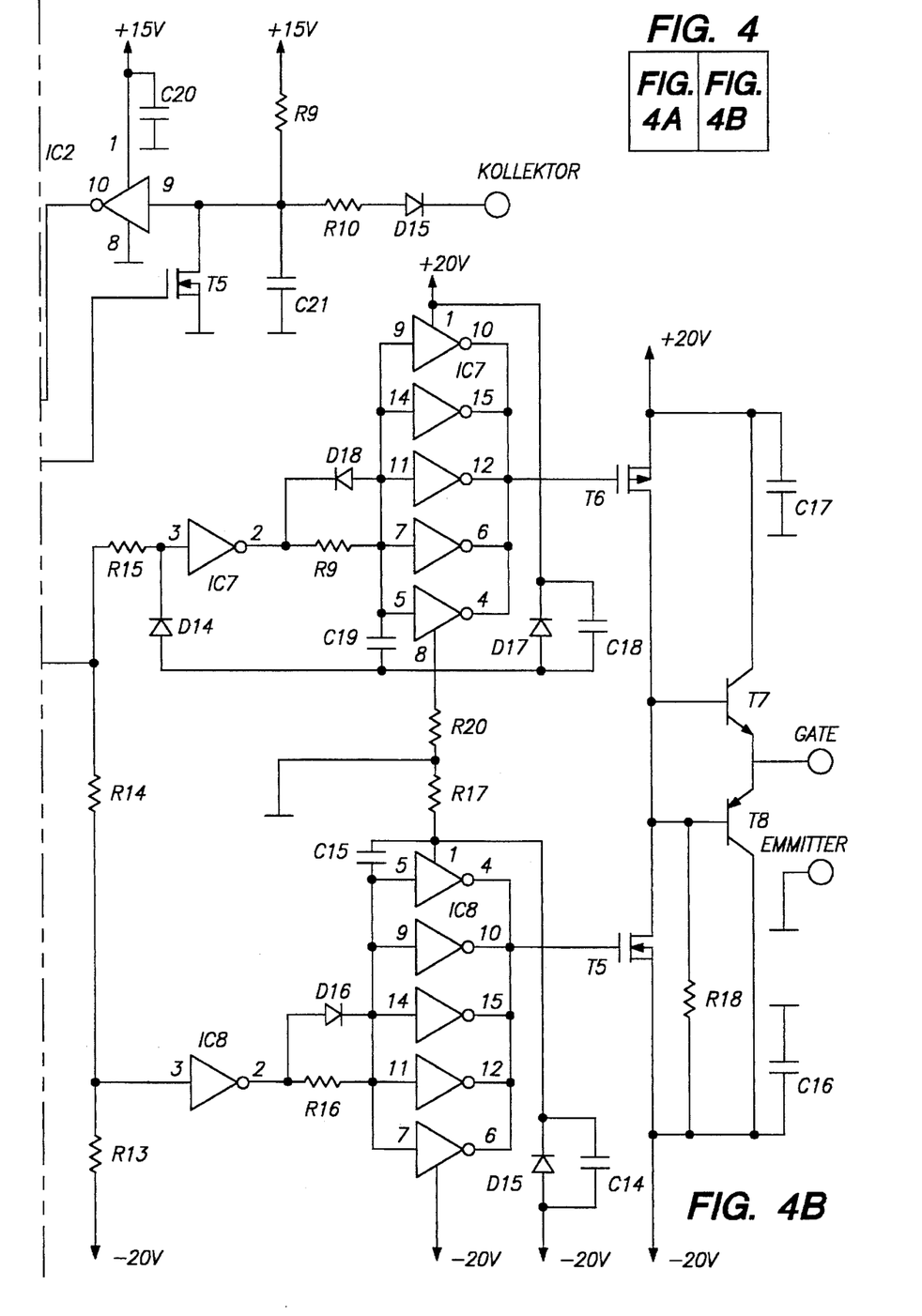
FIG. 4 is an electric circuit diagram of the driver circuit for an IGBT power output stage according to FIG. 3.
Figure 4A:
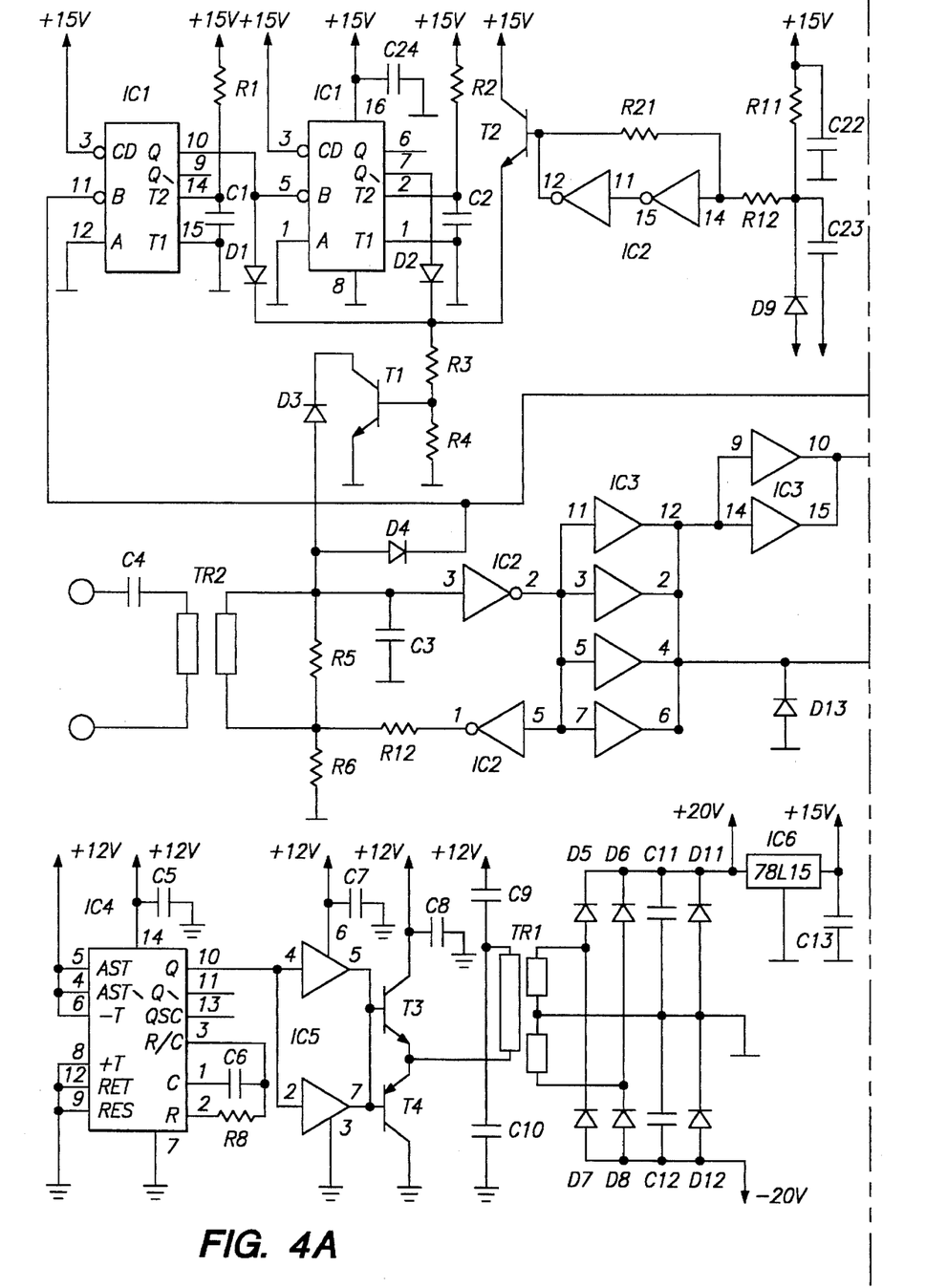

The embodiment of the driver circuit as illustrated in FIGS. 3 and 4 differs from the one illustrated in FIGS. 1 and 2 in that it is provided for a power output stage formed of IGBT transistors. In order to trigger such a power output stage it is necessary to increase the activation signals to a level of about +/−20 V. Level converter 150 shown in FIG. 3 which is supplied by temporary memory stage 80 is provided therefore. Level converter 150 is then followed by an accordingly designed power driver stage 160.

The driver circuits of FIGS. 1 and 3 correspond to each other. The circuits of FIGS. 2 and 4 show differences in circuitry in individual details only.

In order to have a voltage increase of +/−20 V for activating the power output stage with IGBTs, the output signal of memory element 92 is fed to two separate driver stages composed of the respective series circuits of inverters IC7, IC8, wherein the driver stage of IC7 is operated at an operating voltage potential of ground up to +20 V, and the driver stage of IC8 is operated at an operating voltage potential of ground up to −20 V. Each of the operating voltages is stabilized by a respective Zener diode D17, D15, to each of which an electrolyte capacitor C18, C14 is coupled in parallel.

In order to achieve an adaptation of the level of the output signal of memory element 92, the output signal is fed to a voltage divider made of resistors R13, R14, R15, the output signal of memory element 92 being supplied between resistors R14 and R15. The other terminal of resistor R15 leads to an inverter of IC7, the output of which is coupled to the inputs of five inverters coupled in parallel of the IC7, via a delay circuit made of resistor R19, diode D18 coupled parallely thereto, and a capacitor C19 coupled to ground.

Accordingly, the coupling point between resistors R13 and 14 is coupled to an inverter of IC8, the output of which is coupled to the inputs of five inverters of the IC8 coupled in parallel, via a delay member of resistor R16, diode D16 coupled thereto in parallel, and a capacitor C15 coupled to ground.

Each of the outputs of the inverters of IC7 and IC8 which are coupled in parallel in each case leads to the gate terminal of an N-channel MOSFET and a P-channel MOSFET T6, T5, respectively. The two MOSFETs T5, T6 are coupled as half-bridge and serve to activate a push-pull stage of two bipolar transistors T7, T8 which are coupled to each other as shown in the diagram of FIG. 2. Each of the delay circuits has a time constant of about 20 ns and serves to prevent a short-circuit of the half-bridge made of the two MOSFETs T5, T6.

Since the low voltage detection stage prevents an activation of the power driver stage when an operating voltage supplied by the power supply stage falls below a predetermined value, it is ensured that the activation signals for the power output stage are always dimensioned such that the latter does not reach the linear operating state.

With the high current detection stage preventing an activation of the power driver stage, when the drain source voltage (with MOSFET output stage) or the collector voltage (with IGBT output stage) of the power output stage exceeds a predetermined value, it is ensured that the power output stage cannot be overloaded, which effectively prevents a failure of the power output stage.

The input stage advantageously comprises a high-frequency signal transmitting transformer for feeding activation signals. This allows for a triggering having a lower limit in the DC signal range and an upper limit in the MHz range. Besides, such a transformer allows to transfer duty cycles of the input signal of 0%–100%.

For preventing with rapidly operating power elements a feeding of interferences, the transformer preferably has a shield at the primary side and/or at the secondary side. This shielded transformer can in particular be a (donut-shaped) ring core bearing a metal layer which is slotted along its periphery.

The trigger circuit in the driver circuit according to the invention comprises a memory element for storing the activation signals to be able to provide activation signals without time delay, with the trigger transformer having a structural size as small as possible. Preferably, the memory element is a flip-flop formed of two inverters whose operation is level-controlled.

In a preferred embodiment, the power supply stage comprises a transformer for transmitting electrical power which can be supplied with high-frequency electrical power. Due to the supply with high-frequency power it is possible to use a very small-size transformer while at the same time a sufficient power is available for the voltage supply of the driver circuit.

This applies in particular when the transformer transmits an electrical power signal having a frequency in the range of 0.5 MHz to 5 MHz, preferable 1.5 MHz.

The respective electrical power signal is preferably a square wave pulse train which is fed to the transformer by an amplifying stage energized by an oscillator.

The transformer preferably has a shield at the primary side and/or at the secondary side to provide a power supply which is reaction-free and nondirectional as much as possible with little interference. Besides, a transformer designed in this manner causes in the present driver circuit that adjacent switching circuits are not penetrated by any interference signals caused by activation signals. In principle, the transformer may have the same setup and structure as the transformer for the input stage.

To have an operation of the power output stage as free from interferences as possible (at high temperatures), it is advantageous when the activation signals can reciprocate between a positive level and a negative level. To this end, it is necessary that the power supply stage provides a positive level and a negative voltage. It is still possible to operate the driver circuit according to the invention e.g. coupled to a regular 12 V current source, for all required operation voltage levels are generated therefrom by the specific power supply stage. This is of advantage in particular for mobile use (power-supplied motor vehicles or the like).

The low voltage detection stage preferably comprises a comparator which has an adjustable hysteresis curve. This allows to determine the operational safety of the overall arrangement (driver circuit with power output stage) within wide boundaries.

The comparator is in particular formed of two serially coupled, looped-back inverters, at the input of which a Zener diode having a predetermined breakthrough voltage (Zener voltage) is coupled.

The peculiarity of a comparator of such construction (with CMOS inverters) resides in that the inverters are not in the switching mode upon approaching the switching point, but in the linear mode. This results in the current consumption increasing considerably (about 35 mA). In the switching point, the power supply is additionally loaded when the operating voltage is increased. The comparator toggles if the operating voltage can increase further against said load. The activation signals are enabled, as a consequence. At the same time, the current consumption of the comparator falls again to about 1 mA. In case of interference, the additionally increased current consumption of the circuit contributes to a further voltage decrease whereby the switching point is reached even more rapidly and safely. If the switching point has been passed, the current consumption goes back to the normal value (about 1 mA for IC4).

In a preferred embodiment, the low voltage detection stage emits a signal for disabling the trigger circuit when one of the operating voltages supplied by the power supply stage falls below a predetermined value.

The high current detection stage preferably comprises an inverter which emits an inhibiting signal for disabling the trigger circuit when the drain source voltage, or the collector voltage, of the power output stage exceeds a predetermined value.

In particular, the inverter supplies an inhibiting signal in this case to the memory element of the input stage.

The inverter of the high current detection stage has an RC network at its input in order to effect a response delay of the high current detection stage upon switching on, which is so dimensioned that the power output stage can become entirely conductive.

Preferably, the RC network is dimensioned such that, after switching on, the high current detection stage can supply an inhibiting signal after a response delay of less than 100 ns only.

A preferred embodiment of the driver circuit has a repeat pulse inhibiting stage, which prevents a cancelling of disabling the input stage caused by the inhibiting signal of the inverter of the high current detection stage. This makes it possible to switch-off the power transistors of the power output stage and to prevent their being switched-on again for a predetermined period of time. In the case of short-circuiting, this safeguards against a thermal overload. Because of the high reaction speed of the high current detection stage in the case of short-circuiting, the conventional di/dt limiter choke coils can be omitted.

Preferably, two serially coupled CMOS monoflops are used so that a double pulse inhibition is achieved with the result that the inhibit times are in the range of seconds.

When a MOSFET output stage is used as power output stage, the power driver stage preferably has a plurality of parallely coupled inverters whose outputs are coupled to two driver transistors which generate the signals required for activating the input of the power output stage.

The present invention can be used both for power output stages with power MOSFET and also with power IGBT; it is only the power driver stage activating the power output stage that has to be adjusted accordingly. The differences between MOSFET and IGBT mainly reside in that IGBTs, in contrast to MOSFETs, cannot be coupled parallely. Besides, IGBTs do not have a temperature-responsive forward resistance and require high gate voltages while having at the same time much higher input capacities.

When an IGBT output stage is used as power output stage, the power driver stage has a level conversion stage and at least two separate inverter ICs operating at different operating voltage levels, each output of which is coupled to a driver transistor stage supplying the signals required for activating the input of the power output stage.

Preferably, the driver transistor stage comprises a halfbridge formed of a P-channel MOSFET and an N-channel MOSFET, and the power driver stage comprises at least one dead time circuit (of about 20 ns) for the activation signal. A bridge short-circuit of the MOSFET half-bridge can thereby be avoided.

Said MOSFET half-bridge controls two complementary, bipolar PNP or NPN power transistors coupled in emitter follower circuit in the B-mode operation which supply the activation signal for the IGBT power output stage.

Such a power driver stage operates with very little loss and warrants that with a capacitive loading output currents of up to +/–12 A and gate voltages of up to +/–20 V can be supplied as input signal for the power output stage.

In all, the following advantages and properties are attained with the driver circuit according to the invention. The structural size is small and the manufacturing costs are low. All inverters may be CMOS inverters with low power consumption. The propagation times from the signal input to the activation input of the power output stage are extremely short (in the range of 100 ns for MOSFET output stages and about 150 ns to 180 ns for IGBT output stages). With MOSFET output stages it is possible to readily activate simultaneously in parallel a plurality of similar output stages. Also the differences in propagation times of a plurality of parallely operated driver circuits according to the invention are very small. They are in the range of 13 ns. This means that complete power switch assemblies (driver circuit with power output stage) can be parallely coupled by very small output choke coils. The power output stages are subject to a low-impedance activation even if the supply voltage is not applied and hence the sequence of switching-on or switching-off the driver circuit and the power output stage may be any desired one. The tolerance to voltage variations (du/dt tolerance) is very high.

In a driver circuit according to the invention which is designed for IGBT output stages it results as advantage that very powerful IGBT power output stages with input capacities of more than 100 nF can be operated at clock frequencies of more than 50 kHz. The voltage slope rate at the activation input of the IGBT output stage is 100 V/us at a load of 100 nF/1 ohm.

Since IGBTs switch much more slowly than MOSFETs, the additional propagation times and dead times do not entail a negative influence.

Figure 5:
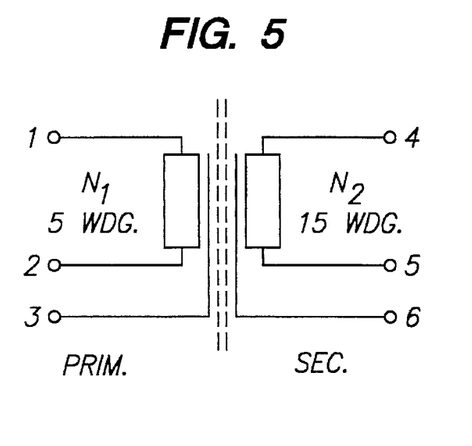
FIG. 5 is an electric circuit diagram of the transformer for the input stage.
Figure 6:
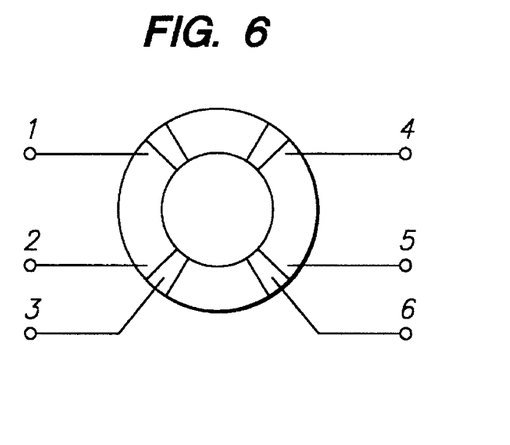
FIG. 6 shows the transformer for the input stage according to FIG. 5 in a schematic plan view.
Figure 7:
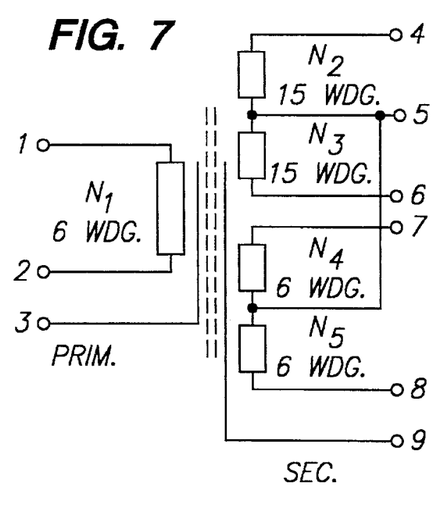
FIG. 7 is an electric circuit diagram of the transformer for the power supply stage.
Figure 8:
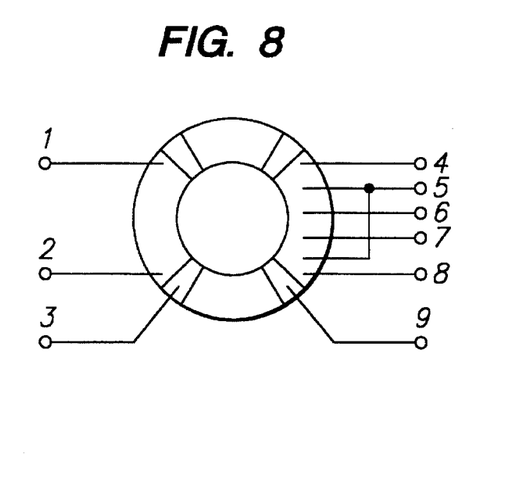
FIG. 8 shows the transformer for the power supply stage according to FIG. 7 in a schematic plan view.

FIGS. 5 and 6 illustrate in detail the transformer for the activation signals. FIGS. 7 and 8 detail the transformer for the power supply. The shielding of the ferrite ring core transformers is in both cases effected by a metallic coat M applied on the ferrite ring and being dimensioned such that the respective windings N of the transformers are shielded with respect to the ferrite ring. The shield is slotted radially to prevent short-circuiting such that any short-circuit winding is avoided. Each of the shields M is within its respective circuits coupled to ground.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent that to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components, frequencies and voltage levels disclosed herein.

We claim:

1. A driver circuit for a power output stage, comprising:
   a. a power driver stage for activating a power output stage;
   b. a trigger circuit having an input stage and coupled for activating the power driver stage, the input stage having means for the potential-separated feeding of input signals comprising a high-frequency signal transmitting transformer for feeding activation signals;
   c. a power supply stage coupled to supply power to the driver circuit, the power supply stage having means for the potential-separated feeding of electrical power; and
   d. a low voltage detection stage which inhibits the power driver stage when an operating voltage supplied by the power supply stage falls below a predetermined value.

2. The driver circuit according to claim 1 wherein the trigger circuit comprises a memory element for storing the activation signals.

3. The driver circuit according to claim 2 wherein the memory element includes a flip-flop comprising two inverters.

4. The driver circuit according to claim 1 wherein the transformer has a shield at a primary side.

5. The driver circuit according to claim 1 wherein the transformer has a shield at a secondary side.

6. The driver circuit according to claim 1 wherein the power supply stage provides for positive and negative operating voltages.

7. A driver circuit for a power output stage, comprising:
   a. a power driver stage for activating a power output stage;
   b. a trigger circuit having an input stage and coupled for activating the power driver stage, the input stage having means for the potential-separated feeding of input signals;
   c. a power supply stage coupled to supply power to the driver circuit, the power supply stage having means for the potential-separated feeding of electrical power comprising a transformer for transmitting high-frequency electrical power; and
   d. a low voltage detection stage which inhibits the power driver stage when an operating voltage supplied by the power supply stage falls below a predetermined value.

8. The driver circuit according to claim 7 wherein the transformer transmits an electrical power signal having a frequency in the range between 0.5 MHz and 5 MHz.

9. The driver circuit according to claim 8 wherein the electrical power signal is a square wave pulse train which is fed to the transformer by an amplifying stage energized by an oscillator.

10. The driver circuit according to claim 7 wherein the transformer has a shield at a primary side.

11. The driver circuit according to claim 7 wherein the transformer has a shield at a secondary side.

12. The driver circuit according to claim 7 wherein the power supply stage provides for positive and negative operating voltages.

13. A driver circuit for a power output stage, comprising:
   a. a power driver stage for activating a power output stage;
   b. a trigger circuit having an input stage and coupled for activating the power driver stage, the input stage having means for the potential-separated feeding of input signals;
   c. a power supply stage coupled to supply power to the driver circuit, the power supply stage having means for the potential-separated feeding of electrical power; and
   d. a low voltage detection stage which inhibits the power driver stage when an operating voltage supplied by the power supply stage falls below a predetermined value wherein the low voltage detection stage comprises a comparator having an adjustable hysteresis curve.

14. The driver circuit according to claim 13 wherein the comparator is formed of two serially coupled looped-back inverters, at the input of which a Zener diode is coupled.

15. A driver circuit for a power output stage, comprising:
   a. a power driver stage for activating a power output stage;
   b. a trigger circuit having an input stage and coupled for activating the power driver stage, the input stage having means for the potential-separated feeding of input signals;
   c. a power supply stage coupled to supply power to the driver circuit, the power supply stage having means for the potential-separated feeding of electrical power; and
   d. a low voltage detection stage which inhibits the power driver stage when an operating voltage supplied by the power supply stage falls below a predetermined value wherein the low voltage detection stage emits a signal for disabling the trigger circuit when an operating voltage supplied by the power supply stage falls below a predetermined value.

16. The driver circuit according to claim 15 wherein a repeat pulse inhibiting stage is provided which prevents a cancellation of disabling the trigger circuit caused by an inhibiting signal of an inverter of a high current detection stage.

17. A driver circuit for a power output stage, comprising:
   a. a power driver stage for activating a power output stage wherein the power driver stage comprises a plurality of parallely coupled inverters, the outputs of which are coupled to two driver transistors which provide signals required to activate an input terminal of the power output stage;
   b. a trigger circuit having an input stage and coupled for activating the power driver stage, the input stage having means for the potential-separated feeding of input signals;
   c. a power supply stage coupled to supply power to the driver circuit, the power supply stage having means for the potential-separated feeding of electrical power; and
   d. a low voltage detection stage which inhibits the power driver stage when an operating voltage supplied by the power supply stage falls below a predetermined value.

18. The driver circuit according to claim 17 wherein the power driver stage comprises a level converter stage and at least two separate inverters which operate at different voltage levels, the outputs of which are coupled to a driver transistor stage which comprises the two driver transistors which provide the signals required to activate the input terminal of the power output stage.

19. The driver circuit according to claim 18 wherein the driver transistor stage comprises a half-bridge formed of a P-channel MOSFET and an N-channel MOSFET and the power driver stage having at least one dead time circuit for the activation signal.

20. A driver circuit for a power output stage, comprising:
   a. a power driver stage for activating a power output stage;
   b. a trigger circuit having an input stage and coupled for activating the power driver stage, the input stage having means for the potential-separated feeding of input signals comprising a high-frequency signal transmitting transformer for feeding activation signals;
   c. a power supply stage coupled to supply power to the driver circuit, the power supply stage having means for the potential-separated feeding of electrical power; and
   d. a high current detection stage which inhibits the power driver stage when a drain source voltage of the power output stage exceeds a predetermined value.

21. The driver circuit according to claim 20 wherein the trigger circuit comprises a memory element for storing the activation signals.

22. The driver circuit according to claim 21 wherein the memory element includes a flip-flop comprising two inverters.

23. The driver circuit according to claim 20 wherein the transformer has a shield at a primary side.

24. The driver circuit according to claim 20 wherein the transformer has a shield at a secondary side.

25. The driver circuit according to claim 20 wherein the power supply stage provides for positive and negative operating voltages.

26. A driver circuit for a power output stage, comprising:
   a. a power driver stage for activating a power output stage;
   b. a trigger circuit having an input stage and coupled for activating the power driver stage, the input stage having means for the potential-separated feeding of input signals;
   c. a power supply stage coupled to supply power to the driver circuit, the power supply stage having means for the potential-separated feeding of electrical power comprising a transformer for transmitting high-frequency electrical power; and
   d. a high current detection stage which inhibits the power driver stage when a drain source voltage of the power output stage exceeds a predetermined value.

27. The driver circuit according to claim 26 wherein the transformer transmits an electrical power signal having a frequency in the range between 0.5 MHz and 5 MHz.

28. The driver circuit according to claim 27 wherein the electrical power signal is a square wave pulse train which is fed to the transformer by an amplifying stage energized by an oscillator.

29. The driver circuit according to claim 26 wherein the transformer has a shield at a primary side.

30. The driver circuit according to claim 26 wherein the transformer has a shield at a secondary side.

31. The driver circuit according to claim 26 wherein the power supply stage provides for positive and negative operating voltages.

32. A driver circuit for a power output stage, comprising:
   a. a power driver stage for activating a power output stage;
   b. a trigger circuit having an input stage and coupled for activating the power driver stage, the input stage having means for the potential-separated feeding of input signals;
   c. a power supply stage coupled to supply power to the driver circuit, the power supply stage having means for the potential-separated feeding of electrical power; and
   d. a high current detection stage which inhibits the power driver stage when a drain source voltage of the power output stage exceeds a predetermined value wherein the high current detection stage includes an inverter for emitting an inhibiting signal for disabling the trigger circuit when the drain source voltage of the power output stage exceeds a predetermined value.

33. The driver circuit according to claim 32 wherein the inverter feeds an inhibiting signal to a memory element of the trigger circuit.

34. The driver circuit according to claim 33 wherein the inverter comprises an RC network at its input which causes a response delay of the high current detection stage and is dimensioned such that the power output stage can become entirely conductive.

35. The driver circuit according to claim 34 wherein a minimum on-time of less than 100 ns is achieved with the RC network and the inverter.

36. The driver circuit according to claim 32 wherein a repeat pulse inhibiting stage is provided which prevents a cancellation of disabling the trigger circuit caused by the inhibiting signal of the inverter of the high current detection stage.

37. A driver circuit for a power output stage, comprising:
   a. a power driver stage for activating a power output stage wherein the power driver stage comprises a plurality of parallely coupled inverters, the outputs of which are coupled to two driver transistors which provide signals required to activate an input terminal of the power output stage;
   b. a trigger circuit having an input stage and coupled for activating the power driver stage, the input stage having means for the potential-separated feeding of input signals comprising;

c. a power supply stage coupled to supply power to the driver circuit, the power supply stage having means for the potential-separated feeding of electrical power; and d. a high current detection stage which inhibits the power driver stage when a drain source voltage of the power output stage exceeds a predetermined value.

38. The driver circuit according to claim 37 wherein the power driver stage comprises a level converter stage and at least two separate inverters which operate at different voltage levels, the outputs of which are coupled to a driver transistor stage which comprises the two driver transistors which provide the signals required to activate the input terminal of the power output stage.

39. The driver circuit according to claim 38 wherein the driver transistor stage comprises a half-bridge formed of a P-channel MOSFET and an N-channel MOSFET and the power driver stage having at least one dead time circuit for the activation signal.

40. A driver circuit for a power output stage, comprising:

a. a power driver stage for activating a power output stage;

b. a trigger circuit having an input stage and coupled for activating the power driver stage, the input stage having means for the potential-separated feeding of input signals comprising a high-frequency signal transmitting transformer for feeding activation signals;

c. a power supply stage coupled to supply power to the driver circuit, the power supply stage having means for the potential-separated feeding of electrical power; and d. a high current detection stage which inhibits the power driver stage when a collector voltage of the power output stage exceeds a predetermined value.

41. The driver circuit according to claim 40 wherein the trigger circuit comprises a memory element for storing the activation signals.

42. The driver circuit according to claim 41 wherein the memory element includes a flip-flop comprising two inverters.

43. The driver circuit according to claim 40 wherein the transformer has a shield at a primary side.

44. The driver circuit according to claim 40 wherein the transformer has a shield at a secondary side.

45. The driver circuit according to claim 40 wherein the power supply stage provides for positive and negative operating voltages.

46. A driver circuit for a power output stage, comprising:

a. a power driver stage for activating a power output stage;

b. a trigger circuit having an input stage and coupled for activating the power driver stage, the input stage having means for the potential-separated feeding of input signals;

c. a power supply stage coupled to supply power to the driver circuit, the power supply stage having means for the potential-separated feeding of electrical power comprising a transformer for transmitting high-frequency electrical power; and d. a high current detection stage which inhibits the power driver stage when a collector voltage of the power output stage exceeds a predetermined value.

47. The driver circuit according to claim 46 wherein the transformer transmits an electrical power signal having a frequency in the range between 0.5 MHz and 5 MHz.

48. The driver circuit according to claim 47 wherein the electrical power signal is a square wave pulse train which is fed to the transformer by an amplifying stage energized by an oscillator.

49. The driver circuit according to claim 46 wherein the transformer has a shield at a primary side.

50. The driver circuit according to claim 46 wherein the transformer has a shield at a secondary side.

51. The driver circuit according to claim 46 wherein the power supply stage provides for positive and negative operating voltages.

52. A driver circuit for a power output stage, comprising:

a. a power driver stage for activating a power output stage;

b. a trigger circuit having an input stage and coupled for activating the power driver stage, the input stage having means for the potential-separated feeding of input signals;

c. a power supply stage coupled to supply power to the driver circuit, the power supply stage having means for the potential-separated feeding of electrical power; and d. a high current detection stage which inhibits the power driver stage when a collector voltage of the power output stage exceeds a predetermined value wherein the high current detection stage includes an inverter for emitting an inhibiting signal for disabling the trigger circuit when the collector voltage of the power output stage exceeds a predetermined value.

53. The driver circuit according to claim 52 wherein the inverter feeds an inhibiting signal to a memory element of the trigger circuit.

54. The driver circuit according to claim 53 wherein the inverter comprises an RC network at its input which causes a response delay of the high current detection stage and is dimensioned such that the power output stage can become entirely conductive.

55. The driver circuit according to claim 54 wherein a minimum on-time of less than 100 ns is achieved with the RC network and the inverter.

56. The driver circuit according to claim 52 wherein a repeat pulse inhibiting stage is provided which prevents a cancellation of disabling the trigger circuit caused by the inhibiting signal of the inverter of the high current detection stage.

57. A driver circuit for a power output stage, comprising:

a. a power driver stage for activating a power output stage wherein the power driver stage comprises a plurality of parallely coupled inverters, the outputs of which are coupled to two driver transistors which provide signals required to activate an input terminal of the power output stage;

b. a trigger circuit having an input stage and coupled for activating the power driver stage, the input stage having means for the potential-separated feeding of input signals;

c. a power supply stage coupled to supply power to the driver circuit, the power supply stage having means for the potential-separated feeding of electrical power comprising; and d. a high current detection stage which inhibits the power driver stage when a collector voltage of the power output stage exceeds a predetermined value.

58. The driver circuit according to claim 57 wherein the power driver stage comprises a level converter stage and at least two separate inverters which operate at different voltage levels, the outputs of which are coupled to a driver transistor stage which comprises the two driver transistors which provide the signals required to activate the input terminal of the power output stage.

59. The driver circuit according to claim 58 wherein the driver transistor stage comprises a half-bridge formed of a P-channel MOSFET and an N-channel MOSFET and the power driver stage having at least one dead time circuit for the activation signal.

* * * * *